(12) United States Patent
Park (10) Patent No.: US 11,759,832 B2
(45) Date of Patent: Sep. 19, 2023

(54) POWDER REMOVING APPARATUS USING SCREW CYLINDER FOR GAS PROCESSING FACILITY

(71) Applicants: Jong Min Park, Anseong-si (KR); Global Standard Technology Co., Ltd, Hwaseong-si (KR)

(72) Inventor: Jong Min Park, Anseong-si (KR)

(73) Assignee: Global Standard Technology Co., Ltd, Hwaseong-si (KR)

( * ) Notice: Subject to any disclaimer, the term of this patent is extended or adjusted under 35 U.S.C. 154(b) by 233 days.

(21) Appl. No.: 17/405,346

(22) Filed: Aug. 18, 2021

(65) Prior Publication Data
US 2022/0402001 A1    Dec. 22, 2022

(30) Foreign Application Priority Data
Jun. 16, 2021 (KR) .................. 10-2021-0077823

(51) Int. Cl.
| | | |
|---|---|---|
| *B08B 9/045* | (2006.01) | |
| *H01L 21/67* | (2006.01) | |
| *B08B 9/08* | (2006.01) | |
| *H01J 37/32* | (2006.01) | |

(52) U.S. Cl.
CPC ........ *B08B 9/045* (2013.01); *H01L 21/67017* (2013.01); *H01L 21/67046* (2013.01); *B01D 2257/708* (2013.01); *B08B 9/0808* (2013.01); *B08B 2209/04* (2013.01); *H01J 37/32844* (2013.01)

(58) Field of Classification Search
CPC ... B08B 9/045; B08B 9/0808; B08B 2209/04; H01L 21/67017; H01L 21/67046; H01J 37/32844; B01D 2257/708
See application file for complete search history.

(56) References Cited

FOREIGN PATENT DOCUMENTS

| | | | |
|---|---|---|---|
| CN | 1274992 C | * | 9/2006 |
| CN | 102200285 A | * | 9/2011 |
| KR | 20-0405303 | | 1/2006 |
| KR | 10-2007-0080004 A | | 8/2007 |
| KR | 10-2010-0021135 A | | 12/2010 |
| KR | 10-1431452 B1 | | 8/2014 |
| KR | 10-1568804 | | 11/2015 |
| KR | 10-2014-0070513 A | | 4/2016 |

* cited by examiner

*Primary Examiner* — Randall E Chin
(74) *Attorney, Agent, or Firm* — Bret E. Field; Bozicevic, Field & Francis LLP (57) ABSTRACT

Proposed is a powder removing apparatus using a screw cylinder for a gas processing facility, in which the powder removing apparatus has a structure in which a scraper is coupled to the screw cylinder that allows a piston rod to be moved forward while being rotated in one direction and to be moved backward while being rotated in a reverse direction according to a supply direction of fluid, thereby allowing the powder adhered to an inner circumferential surface of a pipeline of the gas processing facility or an inner wall surface of the gas processing facility to be easily and efficiently removed. According to an embodiment of the present disclosure, the powder removing apparatus includes the screw cylinder and a scraper.

4 Claims, 5 Drawing Sheets

POWDER REMOVING APPARATUS USING SCREW CYLINDER FOR GAS PROCESSING FACILITY

CROSS REFERENCE TO RELATED APPLICATION

The present application claims priority to Korean Patent Application No. 10-2021-0077823, filed Jun. 16, 2021, the entire contents of which is incorporated herein for all purposes by this reference.

BACKGROUND OF THE INVENTION

Field of the Invention

The present disclosure relates to a powder removing apparatus for a gas processing facility, the powder removing apparatus being configured to remove powder by being installed on a gas processing facility such as a scrubber for an example.

Description of the Related Art

Unless otherwise expressed in this specification, the contents described in this section are not related arts to the claims of the subject application. Also, inclusion of an art in this section does not recognize the art as a related art.

In general, semiconductor manufacturing processes substantially differ according to types of a semiconductor such as a D-RAM, a SD-RAM, a flash memory, a silicon semiconductor, and so on, but in general, a semiconductor is manufactured by performing a wafer fabricating process and a packaging process, in which the wafer fabricating process includes a wafer manufacturing process, a circuit designing and a mask manufacturing process, oxidizing, sensitizing, exposing, developing, etching, asking, chemical vapor deposition (CVD), and so on. For example, the semiconductor manufacturing process that is described above is also applied to a manufacturing process of a display such as a flat panel display (FPD).

In the semiconductor manufacturing process, process gases such as high purity $H_2$, high purity $SiH_4$ (monosilane), high purity $SiHCl_3$ (trichlorosilane), or the like is used, and in the CVD process, special process gases such as $SiH_4$, $SiH_2Cl_2$, $SiHCl_3$, $SiCl_4$, $GeH_4$, $B_2H_6$, $BBr_3$, $BCl_3$, $AsH_3$, $PH_3$, $TeH_2$, $SnCl_4$, $GeCl_4$, $WF_6$, $NH_3$, $CH_4$, $Cl_2$, $MoF_6$, and so on that are provided to have high purity, and high purity $H_2$ and high purity $N_2$ are used as a carrier gas. In addition, in a plasma etching process, process gases such as $SiF_4$, $CF_4$, $C_3F_8$, $C_2F_6$, $CHF_3$, $CClF_3$, $O_2$, and so on are used, and in an ion beam etching process, special gases such as $C_3F_8$, $CHF_3$, $CClF_3$, $CF_4$, and so on are used.

On the other hand, process gases used in the semiconductor manufacturing process have characteristics such as high toxicity, high inflammability, high causticity, and so on, and include hazardous components such as volatile organic compounds (VOCs). Here, the VOCs collectively refer to liquid phase or gas phase organic compounds that are easily evaporated in the atmosphere due to high vapor pressure, and cause photochemical smog by causing photochemical reactions in the atmosphere to produce photochemical oxidizers such as ozone. In addition, the VOCs are substances that cause not only the air pollution but also global warming, and are also carcinogenic substances.

In a manufacturing facility, only a part of such process gases participates in reactions, and the remaining 90% of process gases are discharged from the manufacturing facility in an unreacted state. When discharged process gases (hereinafter, referred to as 'waste process gases') are discharged to the atmosphere without performing a separate purifying process, damaging of surrounding manufacturing facility, serious environmental pollution, and a safety accident of a worker may occur. Therefore, in each manufacturing facility, a gas processing facility that is configured to decompose or purify the waste process gases to be below a reference value is installed on a gas discharging line that is connected by an exhaust duct.

Such a gas processing facility is configured to decompose or purify the waste process gases by using characteristics of the waste process gases. In other words, the characteristics of the waste process gases are such as explosive reaction on air when coming in contact with air, combustibility, reaction on a gas processor, and solubility in water. Among the gas processing facilities, a scrubber may be classified into a dry type scrubber in a high temperature plasma manner, a wet type scrubber using a spraying a cleaning solution, and a mixed type scrubber that adopts both the dry type scrubber and the wet type scrubber.

The dry type scrubber allows the waste process gases to be passed through an inside of a flame of a burner or an inside of plasma so that the waste process gases are directly combusted or oxidized. For example, the dry type scrubber has a structure that allows the waste process gases to be passed through an inside of a high-temperature chamber that is formed by using a heat source so that the waste process gases are thermally decomposed. The dry type scrubber has a prominent effect in processing flammable (combustible) gases, but is incapable of processing non-flammable gases such as water-soluble gases.

The wet type scrubber has a relatively simple configuration that is configured to collect the waste process gases by using spraying of water and configured to clean and cool the collected waste process gases, and has advantages of easy manufacturing and capable of having large-capacity. However, the wet type scrubber is unable to process water insoluble gases. More particularly, the wet type scrubber is incapable of processing waste process gases including a hydrogen group having strong flammability.

The mixed type scrubber is configured to primarily burn waste process gases in a reaction chamber to remove flammable gases and explosive gases and then to secondarily dissolve the water-soluble noxious waste process gases in water by spraying water. The mixed type scrubber in the related art has already been disclosed in Korean Utility Model Registration No. 20-0405303 (published on Jan. 10, 2006), Korean Patent Application Publication No. 10-2010-0021135 (published on Feb. 24, 2010), Korean Patent No. 10-1431452 (published on Aug. 21, 2014), and Korean Patent No. 10-1568804 (published on Nov. 12, 2015).

However, in the gas processing facility that is described above, there is a problem in that an efficiency of gas processing is reduced as powder is adhered to a pipeline of the gas processing facility, an inner wall surface of the gas processing facility, and so on. Therefore, an apparatus for preventing powder from adhering or an apparatus for removing powder is necessary.

For an example of such a powder removing apparatus for a gas processing facility has been disclosed in Korean Patent Application Publication No. 10-2007-0080004 (published on Aug. 9, 2007). In Korean Patent Application Publication No. 10-2007-0080004 (published on Aug. 9, 2007), a powder removing apparatus of a scrubber for processing waste process gases of a semiconductor is disclosed, in which the scrubber is configured of both a burner configured to burn waste process gases at the same time when the waste process gases generated during a semiconductor manufacturing process is introduced thereinto, and a burning chamber coupled to the burner and configured to precipitate powder that is generated when the waste process gases are burned by the burner. Moreover, a gas for removing powder supplying portion that prevents the powder from being deposited on an inner wall surface of the burning chamber is further formed, and includes: a gas supplying pipe coupled outside of the burning chamber; a gas tube connected to the gas supplying pipe and formed in a ring shape along the inner wall of the burning chamber; and at least one gas nozzle coupled to the gas tube and extending inside the burning chamber.

Such a conventional powder removing apparatus for a gas processing facility has a problem in that a gas nozzle or a gas supplying pipe is blocked by adhering of powder so that proper functions are unable to be exhibited.

In addition, an ultrasonic scrubber for a semiconductor manufacturing facility has been disclosed in Korean Patent Application Publication No. 10-2014-0070513 (published on Jun. 10, 2014). In Korean Patent Application Publication No. 10-2014-0070513, an ultrasonic scrubber for a semiconductor manufacturing facility, the ultrasonic scrubber that blocks heat transferred to an ultrasonic converter and minimizes loss of ultrasonic vibration energy and secures efficiency and stability of the ultrasonic converter even in a high-temperature condition is provided. The ultrasonic scrubber includes: a scrubber chamber positioned on an exhaust path of waste process gases generated by a semiconductor processing chamber; an ultrasonic transferring band tightly fixed to the scrubber chamber by surrounding an outer circumferential surface of the scrubber chamber; a vibration transferring member fixedly mounted on the ultrasonic transferring band; an ultrasonic horn having a first end fixedly coupled to the vibration transferring member; an ultrasonic converter coupled to a second end of the ultrasonic horn and configured to provide ultrasonic vibration; an ultrasonic converter driven power amplifier configured to electrically drive the ultrasonic converter; and a cooling unit formed in a cylindrical shape and having a center of circular surfaces of opposite ends provided with through-holes so that the ultrasonic horn is coupled through the through-holes.

However, in a powder removing apparatus having an ultrasonic vibrational type disclosed in the ultrasonic scrubber for a semiconductor manufacturing facility that is described above, there are problems in that the apparatus is relatively large in size since the apparatus has to be installed around the scrubber and a significant amount of electricity is consumed.

Document of Related Art (Patent Document 1) Korean Patent Application Publication No. 10-2007-0080004 (published on Aug. 9, 2007)
(Patent Document 2) Korean Patent Application Publication No. 10-2014-0070513 (published on Jun. 10, 2014)

SUMMARY OF THE INVENTION

Accordingly, the present disclosure has been made keeping in mind the above problems occurring in the related art, and the present disclosure is intended to propose a powder removing apparatus using a screw cylinder for a gas processing facility, in which the powder removing apparatus has a structure in which a scraper is coupled to a screw cylinder that allows a piston rod to be moved forward while being rotated in one direction and to be moved backward while being rotated in a reverse direction according to supply directions of fluid, thereby allowing powder adhered to an inner circumferential surface of a pipeline of the gas processing facility or adhered to an inner wall surface of the gas processing facility to be easily and efficiently removed.

In addition, the present disclosure is not limited to the technical problems as described above, and it is obvious that any other technical problem could be derived from the description of the invention as described below.

According to an aspect of the present disclosure, there is provided a powder removing apparatus using a screw cylinder for gas processing facility, the powder removing apparatus including: a screw cylinder air-tightly installed on the gas processing facility, and provided with a piston rod that is configured to, according to supply directions of fluid, move forward while the piston rod is being rotated in one direction and to move backward while the piston rod is being rotated in a reverse direction; and a scraper coupled to the piston rod of the screw cylinder and extending inside the gas processing facility, the scraper being configured to scrape powder adhered to an inner circumferential surface of a pipeline of the gas processing facility or an inner wall surface of the gas processing facility by being moved forward or backward while the scraper is rotated together with the piston rod at the same time.

The screw cylinder may include: a cylinder body having a backward port formed on a front side thereof, and having a forward port formed on a rear side thereof; a screw shaft fixedly coupled to a rear-end portion of the cylinder body and extending inside the cylinder body; and the piston rod having a rear side screwed to the screw shaft and configured to move forward or backward while being rotated in response to fluid flow to the forward port or the backward port, and having a front-end portion coupled to the scraper.

The scraper may include: a fastening pipe portion fitted to a front-end portion of the piston rod and fastened and fixed to the front-end portion of the piston rod; a scraper shaft extending from the fastening pipe portion; and a bent bar for scraping, the bent bar being branched into two parts from the scraper shaft and extending so as to be formed in a U-shape.

The scraper may be coupled to the piston rod of the screw cylinder by fixing bolts that penetrate both the front-end portion of the piston rod of the screw cylinder and the fastening pipe portion of the scraper at the same time, the fixing bolts including two fixing bolts that are spaced apart from each other and fastened in opposite directions, with anti-decoupling snap rings being fitted to respective fastening end portions of the fixing bolts.

According to an embodiment of the present disclosure, the powder removing apparatus using a screw cylinder for a gas processing facility has a structure in which the scraper is coupled to the screw cylinder that allows the piston rod to be moved forward while being rotated in one direction and to be moved backward while being rotated in a reverse direction according to the supply directions of the fluid, thereby having an advantage in that the powder adhered to the inner circumferential surface of the pipeline of the gas processing facility or adhered to the inner wall surface of the gas processing facility may be easily and efficiently removed.

According to an embodiment of the present disclosure, the powder removing apparatus using a screw cylinder for a gas processing facility has an advantage in that the powder adhered to the inner circumferential surface of the pipeline of the gas processing facility or adhered to the inner wall surface of the gas processing facility may be efficiently removed with low installation cost and low maintenance cost, and with improved gas processing efficiency of the gas processing facility.

The effects of the present disclosure are not limited to the effects mentioned above, and other effects not mentioned will be clearly understood by those skilled in the art from the description of the claims.

BRIEF DESCRIPTION OF THE DRAWINGS

Above and other objectives, features, and other advantages of the present disclosure will be more clearly understood from the following detailed description when taken in conjunction with the accompanying drawings, in which.

DETAILED DESCRIPTION OF THE INVENTION

Hereinafter, a configuration, and an effect of exemplary embodiments of the present disclosure will be described with reference to the accompanying drawings. For reference, in the drawings, each component is omitted or schematically illustrated for convenience and clarity, and the size of each component does not reflect the actual size. In addition, the same reference numerals throughout the specification refer to the same components, and the reference numerals for the same components in the individual drawings will be omitted.

Figure 1:
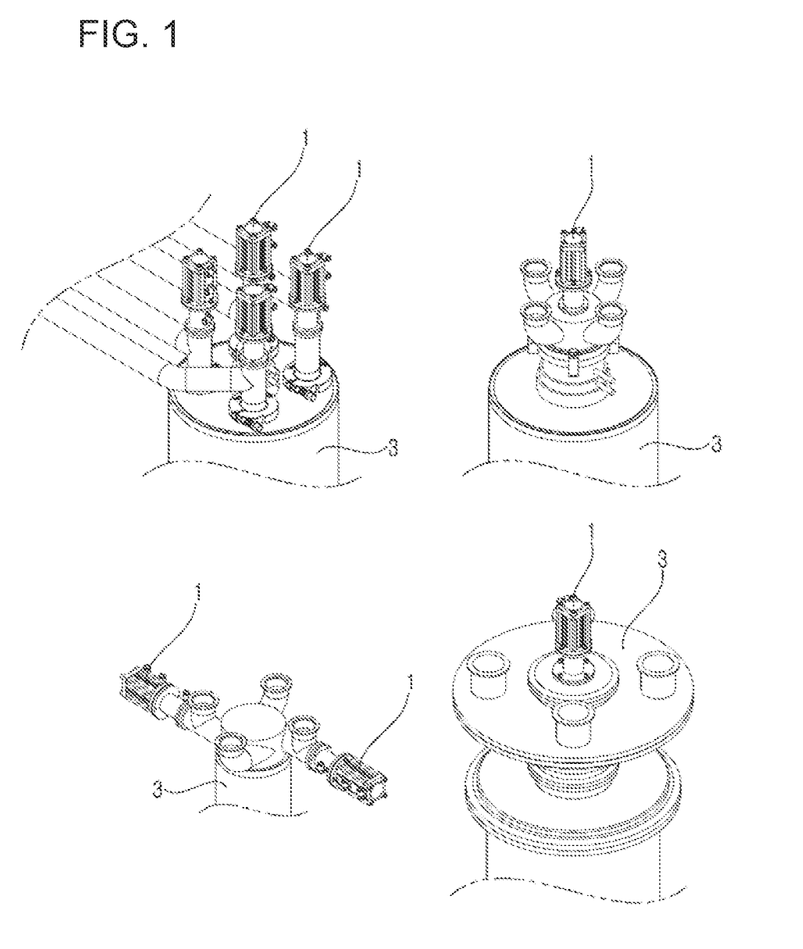
FIG. 1 is a view schematically illustrating installation structures of a powder removing apparatus using a screw cylinder for a gas processing facility according to embodiments of the present disclosure.

FIG. 1 is a view schematically illustrating installation structures of a powder removing apparatus using a screw cylinder for a gas processing facility according to embodiments of the present disclosure.

As illustrated in FIG. 1, a powder removing apparatus 1 using a screw cylinder for a gas processing facility according to an embodiment of the present disclosure is air-tightly installed on a gas processing facility 3 such as a scrubber for an example, in which the scrubber is configured to purify waste gas that is used in a semiconductor manufacturing process or a display manufacturing process. Therefore, the powder removing apparatus 1 serves to scrape and remove powder adhered to an inner circumferential surface of a pipeline of the gas processing facility 3 or adhered to an inner wall surface of the gas processing facility 3.

According to an embodiment of the present disclosure, the powder removing apparatus 1 using a screw cylinder for a gas processing facility may be installed on the pipeline of the gas processing facility 3 and may remove powder adhered to the inner circumferential surface of the pipeline by scraping the powder, or may be installed on a center of an upper portion of the gas processing facility 3 and may remove powder adhered to an inner wall surface of the gas processing facility 3 by scraping the powder.

Figure 2:
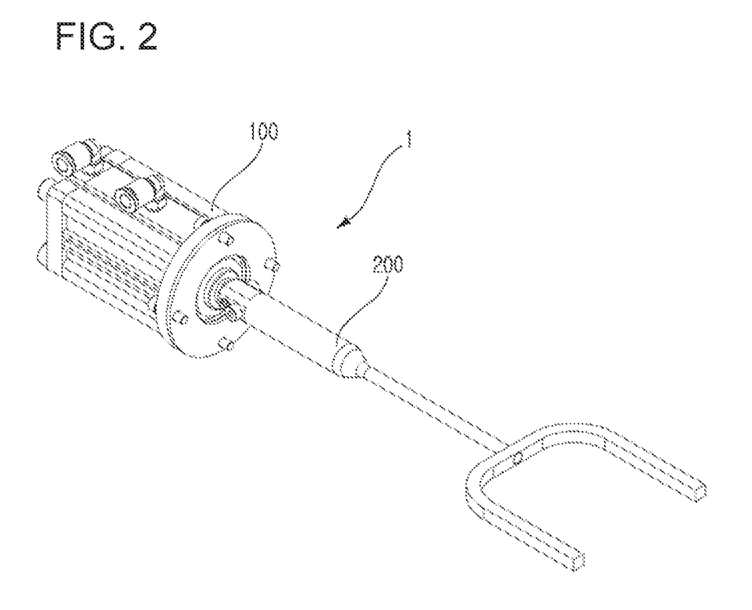
FIG. 2 is a perspective view illustrating the powder removing apparatus using a screw cylinder for a gas processing facility according to an embodiment of the present disclosure.
Figure 3:
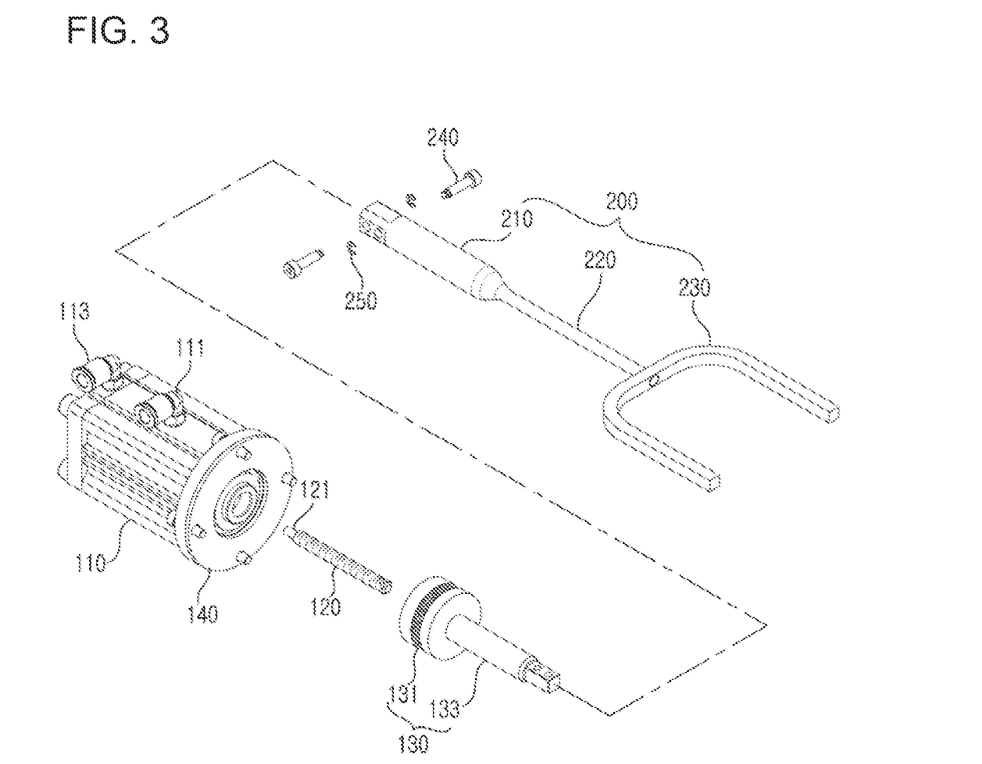
FIG. 3 is an exploded perspective view illustrating the powder removing apparatus using a screw cylinder for a gas processing facility according to an embodiment of the present disclosure.
Figure 4:
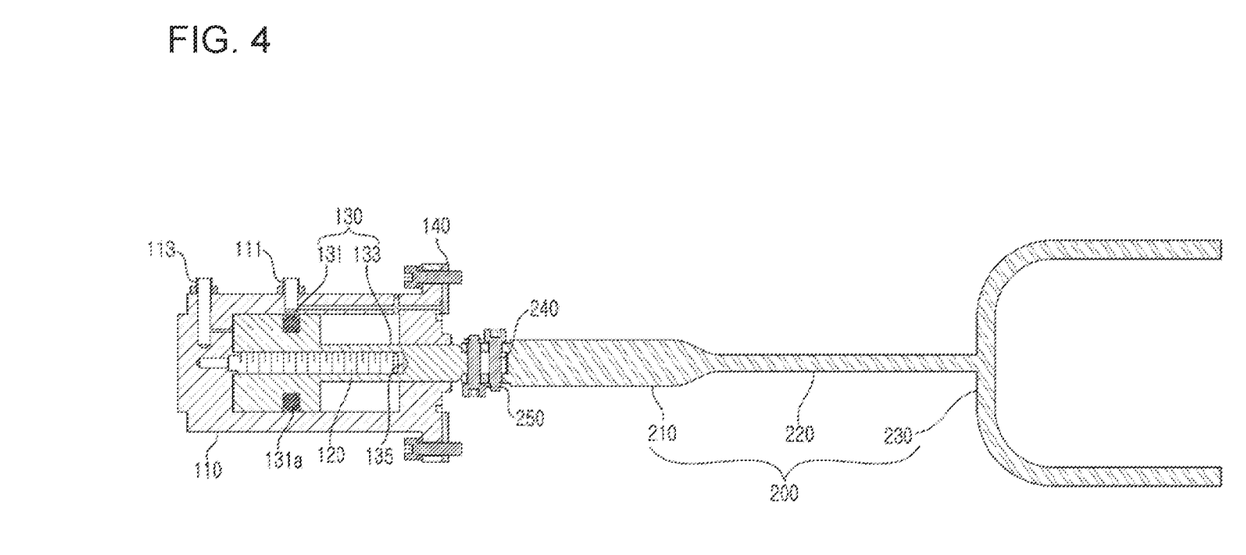
FIG. 4 is a cross-sectional view illustrating a structure of the powder removing apparatus using a screw cylinder for a gas processing facility according to an embodiment of the present disclosure.

FIG. 2 is a perspective view illustrating the powder removing apparatus using a screw cylinder for a gas processing facility according to an embodiment of the present disclosure. FIG. 3 is an exploded perspective view illustrating the powder removing apparatus using a screw cylinder for a gas processing facility according to an embodiment of the present disclosure. FIG. 4 is a cross-sectional view illustrating a structure of the powder removing apparatus using a screw cylinder for a gas processing facility according to an embodiment of the present disclosure.

As illustrated in FIGS. 1 to 4, according to an embodiment of the present disclosure, the powder removing apparatus 1 using a screw cylinder for a gas processing facility includes: a screw cylinder 100 air-tightly installed on the gas processing facility 3, and provided with a piston rod 130 that is configured to, according to supply directions of fluid, move forward while being rotated in one direction and to move backward while the piston rod 130 is being rotated in a reverse direction; and a scraper 200 coupled to the piston rod 130 of the screw cylinder 100 and extending inside the gas processing facility 3, the scraper 200 being configured to scrape powder adhered to an inner circumferential surface of a pipeline of the gas processing facility 3 or adhered to an inner wall surface of the gas processing facility 3 by being moved forward or backward while the scraper 200 is rotated together with the piston rod 130 at the same time.

Here, the screw cylinder 100 corresponds to an actuator that allows the scraper 200 to be moved forward or backward at an inside of the gas processing facility 3 while the scraper 200 is rotated at the same time, and the screw cylinder 100 is air-tightly installed on the gas processing facility 3 with a gasket 140 inserted in between.

The screw cylinder 100 is configured such that the piston rod 130 to which the scraper 200 is coupled is moved according to the supply directions of the fluid so as to the piston rod 130 to be moved forward while being rotated in the one direction and to be moved backward while being rotated in the reverse direction. As illustrated in FIGS. 2 to 4, the screw cylinder 100 includes: a cylinder body 110 having a backward port 111 formed on a front side thereof, and having a forward port 113 formed on a rear side thereof; a screw shaft 120 fixedly coupled to a rear-end portion of the cylinder body 110 and extending inside the cylinder body 110; and the piston rod 130 having a rear side screwed to the screw shaft 120 and configured to move forward or backward while being in response to fluid flow to the forward port 113 or the backward port 111, and having a front-end portion coupled to the scraper 200.

Here, the cylinder body 110 serves to form a housing of the screw cylinder 100, and at the same time, the cylinder body 110 serves to form space for rotating and moving forward and backward of the piston rod 130 that will be described later.

The cylinder body 110 is preferably formed in a cuboid shape, and a through-hole that has a circular cross-section shape for the rotating and the moving forward and backward of the piston rod 130 is formed through along a lengthwise of the cylinder body 110.

In addition, the backward port 111 configured to allow fluid such as compressed air, for example, to be introduced into or discharged out is formed on the front side of the cylinder body 110. The backward port 111 allows the fluid to be introduced into the cylinder body 110 so that the piston rod 130 is moved backward while being rotated, or allows the fluid to be discharged out from the cylinder body 110 so that the piston rod 130 is moved forward while being rotated in the reverse direction. The backward port 111 may be formed as a simple structure that vertically extends from top to bottom, or as illustrated in FIG. 4, the backward port 111 may be formed in a multi-step bent flow path shape that vertically extends from top to bottom, then is bent perpendicularly and horizontally extends, and then vertically extends again.

In addition, the forward port 113 configured to allow fluid such as compressed air, for example, to be introduced into or discharged out is formed on the rear side of the cylinder body 110. The forward port 113 allows the fluid to be introduced into the cylinder body 110 so that the piston rod 130 is moved forward while being rotated, or allows the fluid to be discharged out from the cylinder body 110 so that the piston rod 130 is moved backward while being rotated in a reverse direction.

As illustrated in FIG. 4, the forward port 113 may be formed in an angle-type flow path shape that extends from top to bottom and then is bent perpendicularly and horizontally extends.

The screw shaft 120 is fixedly coupled to the rear-end portion of the cylinder body 110 that is described above, and extends inside the cylinder body 110. The screw shaft 120 serves to allow the piston rod 130 that will be described later to be moved forward or backward while being rotated at the same time according to the supply directions of the fluid with respect to the cylinder body 110.

The screw shaft 120 has a spiral groove formed along an outer circumferential surface thereof, and a coupling end portion 121 fixedly coupled to the rear-end portion of the cylinder body 110 is formed at a rear portion thereof.

At the screw shaft 120 that is described above, the piston rod 130 is screwed so as to be capable of being moved forward or backward while being rotated at the same time. The piston rod 130 is moved forward or backward while being rotated along the screw shaft 120 according to a supply of the fluid to the forward port 113 or the backward port 111, and serves to provide a combined acting force to the scraper 200 that is coupled to the front-end portion of the piston rod 130.

The piston rod 130 includes: a piston portion 131 screwed to the screw shaft 120 and configured to be moved forward or backward in the cylinder body 110 while the piston portion 131 is being rotated in response to fluid flow to the forward port 113 or the backward port 111; and a rod portion 133 integrally formed with the piston portion 131 and extending toward a forward direction, coupled through the front-end portion of the cylinder body 110 so as to be capable of being moved forward and backward and capable of being rotated, and to which the scraper 200 is coupled.

A piston ring 131a is provided at an outer circumference of the piston portion 131, and according to an embodiment, a ball bearing that allows the piston portion 131 to be capable of being rotated and capable of being moved forward and backward may be additionally provided. In addition, a screw shaft groove 135 into which the screw shaft 120 is capable of being inserted is recessively formed across the piston portion 131 and the rod portion 133.

The cylinder body 110 of the screw cylinder 100 that is described above is air-tightly coupled to the gas processing facility 3 with the gasket 140 inserted in between.

The piston rod 130 of the screw cylinder 100 that is described above has the front-end portion coupled to the scraper 200. The scraper 200 extends inside the gas processing facility 3 and is configured to be moved forward or backward while being rotated together with the piston rod 130, and serves to scrape the powder adhered to the inner circumferential surface of the pipeline of the gas processing facility 3 or adhered to the inner wall surface of the gas processing facility 3.

The scraper 200 includes: a fastening pipe portion 210 fitted to the front-end portion of the piston rod 130 and fastened and fixed to the front-end portion of the piston rod 130; a scraper shaft 220 extending from the fastening pipe portion 210; and a bent bar 230 for scraping, the bent bar 230 being branched into two parts from the scraper shaft 220 and extending so as to be formed in a U-shape. At this time, it is preferable that the bent bar 230 for scraping is positioned to be adjacent to a portion at which the scraping is required. Here, the bent bar 230 may be positioned adjacent to the inner circumferential surface of the pipeline of the gas processing facility 3 or to the inner wall surface of the gas processing facility 3. According to an embodiment of the present disclosure, the bent bar 230 for scraping may be in contact with the portion described above.

In addition, the fastening pipe portion 210 is fastened and fixed to the piston rod 130 of the screw cylinder 100. In other words, the rear-end portion of the scraper 200 is fastened and fixed to the piston rod 130 of the screw cylinder 100 by fixing bolts 240 that penetrate both the piston rod 130 of the screw cylinder 100 and the fastening pipe portion 210 of the scraper 200 at the same time. In addition, in order to realize a robust coupling of the fastening pipe portion 210, it is preferable that two fixing bolts 240 are spaced apart from each other and fastened in opposite directions, with anti-decoupling snap rings 250 being fitted to respective fastening end portions of the fixing bolts 240.

Figure 5:
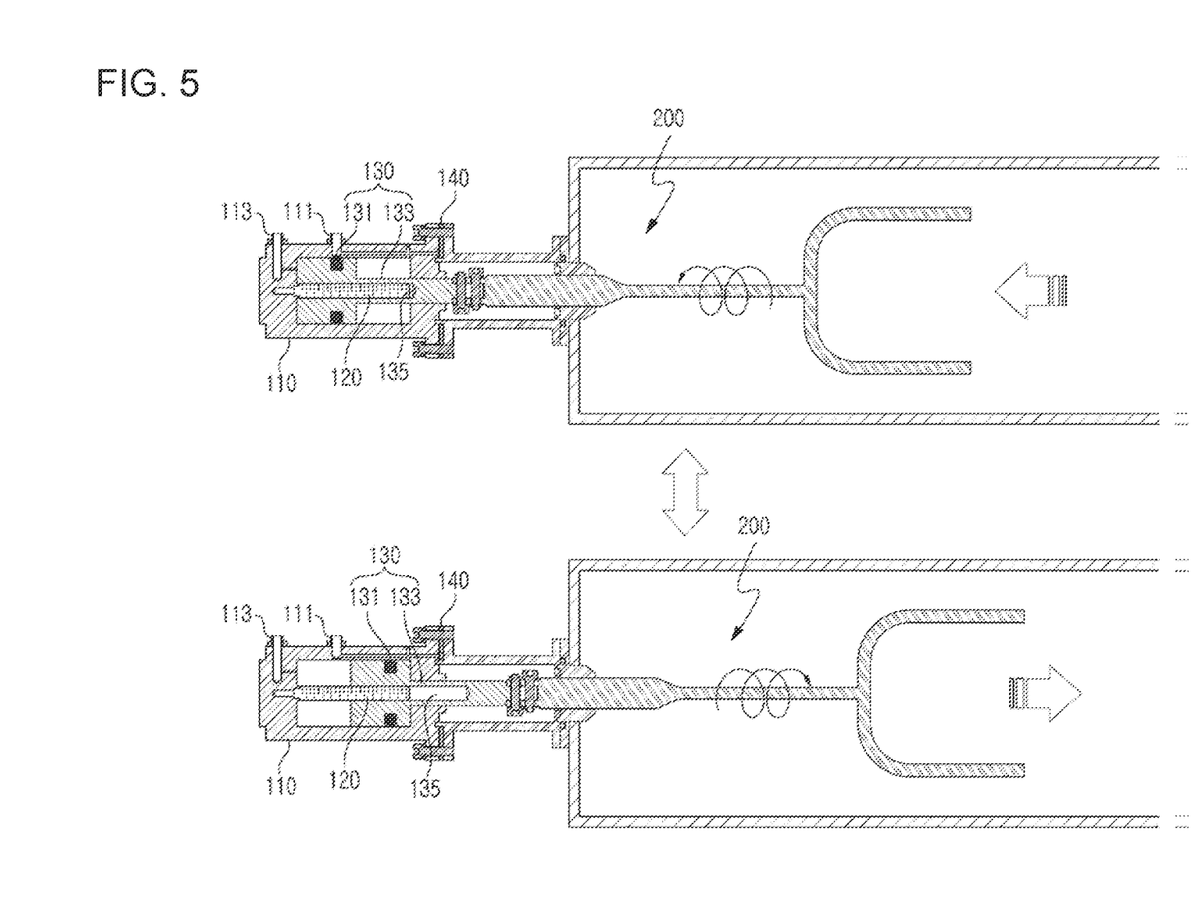
FIG. 5 is a view illustrating an operation of the powder removing apparatus using a screw cylinder for a gas processing facility according to an embodiment of the present disclosure.

FIG. 5 is a view illustrating an operation of the powder removing apparatus using a screw cylinder for a gas processing facility according to an embodiment of the present disclosure. Hereinafter, referring to FIGS. 1 to 5, an overall operation of the powder removing apparatus using a screw cylinder for a gas processing facility according to an embodiment of the present disclosure will be described as follows:

As illustrated in FIG. 5, according to an embodiment of the present disclosure, the powder removing apparatus 1 using a screw cylinder for a gas processing facility is in a state in which the powder removing apparatus 1 is installed on the pipeline of the gas processing facility 3 or to the center of the upper portion of the gas processing facility 3 by using a connecting block and a connecting flange that are formed in a bushing shape. Then, when fluid such as compressed air, for example, is introduced into the cylinder body 110 by passing through the forward port 113 of the cylinder body 110, pressure of the fluid is applied to the piston portion 131 of the piston rod 130 from the rear to the front, and at this time, the piston rod 130 is moved forward while being rotated in one direction along the screw shaft 120. At this time, the fluid filled at a front space of the piston portion 131 is discharged through the backward port 111.

In this situation, the scraper 200 fastened and fixed to the piston rod 130 of the screw cylinder 100 is moved forward while being rotated together with the piston rod 130, and scrapes and removes powder by the bent bar 230 for scraping, in which the powder is adhered to the inner circumferential surface of the pipeline of the gas processing facility 3 or the inner wall surface of the gas processing facility 3.

In addition, when fluid such as compressed air for, example, is introduced into the cylinder body 110 by passing through the backward port 111 of the cylinder body 110, pressure of the fluid is applied to the piston portion 131 of the piston rod 130 from the front to the rear, and at this time, the piston rod 130 is moved backward while being rotated in a reverse direction along the screw shaft 120. At this time, the fluid filled at a rear space of the piston portion 131 is discharged through the forward port 113.

In this situation, the scraper 200 fastened and fixed to the piston rod 130 of the screw cylinder 100 is moved backward while being rotated together with the piston rod 130, and scrapes and removes the powder by the bent bar 230 for scraping, in which the powder is adhered to the inner circumferential surface of the pipeline of the gas processing facility 3 or the inner wall surface of the gas processing facility 3.

Therefore, when the powder removing apparatus 1 using a screw cylinder for a gas processing facility according to an embodiment of the present disclosure is applied, by a structure in which the scraper 200 is coupled to the screw cylinder 100 that allows the piston rod 130 to be moved forward while being rotated in one direction and to be moved backward while being rotated in a reverse direction according to supply directions of fluid, powder adhered to the inner circumferential surface of the pipeline of the gas processing facility 3 or the inner wall surface of the gas processing facility 3 may be easily and efficiently removed.

In addition, the powder adhered to the inner circumferential surface of the pipeline of the gas processing facility 3 or the inner wall surface of the gas processing facility 3 may be efficiently removed with low installation cost and low maintenance cost, and with improved gas processing efficiency of the gas processing facility 3.

Although preferred embodiments of the present disclosure have been described with reference to the accompanying drawings, the embodiments described in the specification and the configurations illustrated in the drawings are merely examples and do not exhaustively present the technical spirit of the present disclosure. Accordingly, it should be appreciated that there may be various equivalents and modifications that can replace the embodiments and the configurations at the time at which the present application is filed. Therefore, preferred embodiments of the present disclosure have been described for illustrative purposes, and should not be construed as being restrictive. The scope of the present disclosure is defined by the accompanying claims rather than the description which is presented above. Moreover, the present disclosure is intended to cover not only the exemplary embodiments, but also various alternatives, modifications, equivalents and other embodiments that may be included within the spirit and scope of the present disclosure as defined by the appended claims.

What is claimed is:

1. A powder removing apparatus using a screw cylinder for a gas processing facility, the powder removing apparatus comprising:
   a screw cylinder air-tightly installed on the gas processing facility, and provided with a piston rod that is configured to, according to supply directions of fluid, move forward while the piston rod is being rotated in one direction and to move backward while the piston rod is being rotated in a reverse direction; and
   a scraper coupled to the piston rod of the screw cylinder and extending inside the gas processing facility, the scraper being configured to scrape powder adhered to an inner circumferential surface of a pipeline of the gas processing facility or an inner wall surface of the gas processing facility by being moved forward or backward while the scraper is rotated together with the piston rod at the same time.

2. The powder removing apparatus of claim 1, wherein the screw cylinder comprises:
   a cylinder body having a backward port formed on a front side thereof, and having a forward port formed on a rear side thereof;
   a screw shaft fixedly coupled to a rear-end portion of the cylinder body and extending inside the cylinder body; and
   the piston rod having a rear side screwed to the screw shaft and configured to move forward or backward while being rotated in response to fluid flow to the forward port or the backward port, and having a front-end portion coupled to the scraper.

3. The powder removing apparatus of claim 1, wherein the scraper comprises:
   a fastening pipe portion fitted to a front-end portion of the piston rod and fastened and fixed to the front-end portion of the piston rod;
   a scraper shaft extending from the fastening pipe portion; and
   a bent bar for scraping, the bent bar being branched into two parts from the scraper shaft and extending so as to be formed in a U-shape.

4. The powder removing apparatus of claim 3, wherein the scraper is coupled to the piston rod of the screw cylinder by fixing bolts that penetrate both the front-end portion of the piston rod of the screw cylinder and the fastening pipe portion of the scraper at the same time, the fixing bolts comprising two fixing bolts that are spaced apart from each other and fastened in opposite directions, with anti-decoupling snap rings being fitted to respective fastening end portions of the fixing bolts.

* * * * *